(12) United States Patent
Kim (10) Patent No.: US 10,950,283 B1
(45) Date of Patent: Mar. 16, 2021

(54) SEMICONDUCTOR DEVICES

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/787,202

(22) Filed: Feb. 11, 2020

(30) Foreign Application Priority Data

Sep. 23, 2019 (KR) .......................... 10-2019-0117092

(51) Int. Cl.
  *G11C 16/16* (2006.01)
  *G11C 7/22* (2006.01)
  *G11C 8/18* (2006.01)

(52) U.S. Cl.
  CPC ................ *G11C 7/222* (2013.01); *G11C 8/18* (2013.01)

(58) Field of Classification Search
  CPC .................................. G11C 8/18; G11C 7/222
  USPC ...................................................... 365/233.11
  See application file for complete search history.

(56) References Cited

U.S. PATENT DOCUMENTS

2014/0368241 A1* 12/2014 Ko .......................... G11C 7/225
                                                         327/143
2019/0066745 A1    2/2019  Wilmoth et al.

FOREIGN PATENT DOCUMENTS

KR        1020180038344 A     4/2018

* cited by examiner

*Primary Examiner* — Xiaochun L Chen
(74) *Attorney, Agent, or Firm* — William Park & Associates Ltd.

(57) ABSTRACT

A semiconductor device includes a latch signal generation circuit and a training result signal generation circuit. The latch signal generation circuit latches a first internal control signal and a second internal control signal to generate a first latch signal and a second latch signal. The first internal control signal is generated based on a first internal clock signal and a control signal, and the second internal control signal is generated. The training result signal generation circuit is synchronized with a first alignment pulse and a second alignment pulse generated based on the first latch signal and the latch signal, thereby generating a training result signal from the first and second latch signals.

22 Claims, 9 Drawing Sheets

SEMICONDUCTOR DEVICES

CROSS-REFERENCE TO RELATED APPLICATIONS

The present application claims priority under 35 U.S.C 119(a) to Korean Application No. 10-2019-0117092, filed on Sep. 23, 2019, which is incorporated herein by reference in its entirety.

BACKGROUND

1. Technical Field

Embodiments of the present disclosure generally relate to semiconductor devices related to executing a training operation of a chip selection signal.

2. Related Art

For portability purposes mobile systems such as portable computers, personal digital assistants (PDAs) and mobile phones have been developed to reduce the weights of these mobile systems. Batteries supplying electric power to the mobile systems may largely affect the total weight of the mobile systems. If power consumption of semiconductor devices employed in the mobile systems is lowered, the capacity of the batteries may also be reduced to thus decrease the total weight of the mobile systems. Fast mobile systems are increasingly in demand with the development of multi-functional mobile systems. Accordingly, data transmission speeds of the semiconductor devices such as mobile memory devices (also, referred to as 'mobile memory chips') may be important factors in determining operation speeds of the high performance mobile systems.

Recently, the semiconductor devices have been designed to simultaneously receive a command and an address through a plurality of pins. In such a case, signals inputted to each semiconductor device through the plurality of pins may include all information on the command and the address, and a command decoder and an address decoder may decode the singles inputted through the plurality of pins to extract the command and the address.

In the case of synchronous semiconductor devices, the command and the address may be inputted in synchronization with a clock signal. For example, double data rate (DDR) semiconductor devices may receive the command and the address in synchronization with a rising edge and a falling edge of the clock signal, and single data rate (SDR) semiconductor devices may receive the command and the address in synchronization with a rising edge of the clock signal.

SUMMARY

According to an embodiment, a semiconductor device may include a latch signal generation circuit and a training result signal generation circuit. The latch signal generation circuit may be configured to latch a first internal control signal and a second internal control signal in synchronization with a latch clock signal to generate a first latch signal and a second latch signal. The first internal control signal may be generated based on a first internal clock signal and a control signal, and the second internal control signal may be generated based on a second internal clock signal and the control signal. The training result signal generation circuit may be configured to be synchronized with a first alignment pulse and a second alignment pulse generated based on the first latch signal and the latch signal, thereby generating a training result signal from the first and second latch signals.

According to another embodiment, a semiconductor device may include a latch signal generation circuit, an alignment pulse generation circuit, and a training result signal generation circuit. The latch signal generation circuit may be configured to latch a first internal control signal and a second internal control signal in synchronization with a latch clock signal to generate a first latch signal and a second latch signal. The first and second internal control signals may be generated based on a control signal, a first internal clock signal, and a second internal clock signal. The alignment pulse generation circuit may be configured to generate a first alignment pulse during a first period when the first latch signal is set to have a predetermined logic level and may be configured to generate a second alignment pulse during a second period when the first latch signal is set to have the predetermined logic level. The training result signal generation circuit may be configured to generate a training result signal having a level transition occurring when the control signal is toggled in synchronization with the first and second internal clock signals.

According to another embodiment, a semiconductor device may include a latch signal generation circuit configured to latch a first internal control signal and a second internal control signal in synchronization with a latch clock signal to generate a first latch signal and a second latch signal, wherein the first internal control signal is generated based on a first internal clock signal and a control signal, and wherein the second internal control signal is generated based on a second internal clock signal and the control signal. The semiconductor device may include a training result signal generation circuit configured to generate a training result signal from the first and second latch signals, the training result signal indicating when the control signal is toggling in synchronization with the first internal clock signal and the second internal clock signal during a test period.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
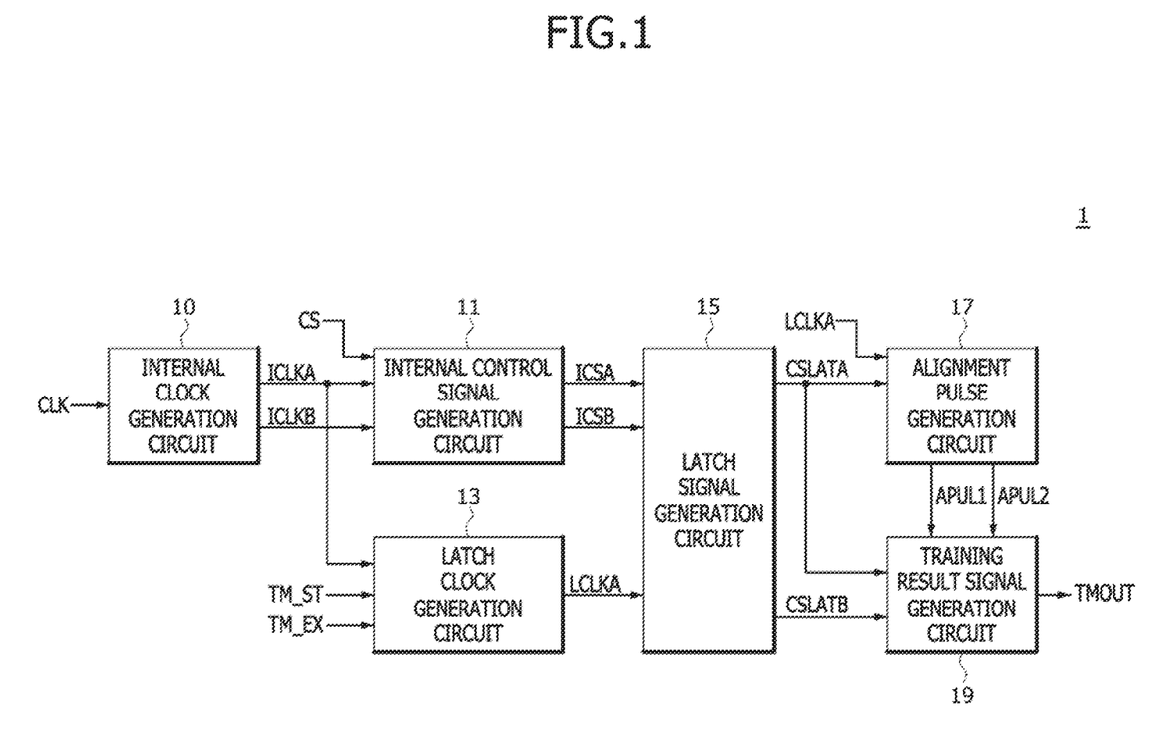
FIG. 1 is a block diagram illustrating a configuration of a semiconductor device according to an embodiment of the present disclosure.

As illustrated in FIG. 1, a semiconductor device 1 may include an internal clock generation circuit 10, an internal control signal generation circuit 11, a latch clock generation circuit 13, a latch signal generation circuit 15, an alignment pulse generation circuit 17, and a training result signal generation circuit 19.

The internal clock generation circuit 10 may divide a clock signal CLK to generate a first internal clock signal ICLKA and a second internal clock signal ICLKB. The first internal clock signal ICLKA and the second internal clock signal ICLKB may be generated to be 2-division signals. A cycle time of the first and second clock signals ICLKA and ICLKB may be set to be twice a cycle time of the clock signal CLK.

The internal control signal generation circuit 11 may latch a control signal CS based on the first and second internal clock signals ICLKA and ICLKB to generate a first internal control signal ICSA and a second internal control signal ICSB. The control signal CS may be set as a chip selection signal for selecting a chip performing various operations such as a read operation and a write operation. The control signal CS may be transmitted from a memory controller (1002 of FIG. 9) to the semiconductor device 1. The internal control signal generation circuit 11 may latch the control signal CS in synchronization with the first internal clock signal ICLKA to generate the first internal control signal ICSA. The internal control signal generation circuit 11 may latch the control signal CS in synchronization with the second internal clock signal ICLKB to generate the second internal control signal ICSB. A configuration and an operation of the internal control signal generation circuit 11 will be described below with reference to FIG. 2.

The latch clock generation circuit 13 may generate a latch clock signal LCLKA based on a test start signal TM_ST, a test exit signal TM_EX, and the first internal clock signal ICLKA. The latch clock generation circuit 13 may generate the latch clock signal LCLKA from the first internal clock signal ICLKA during a test period which is set by the test start signal TM_ST and the test exit signal TM_EX. The latch clock generation circuit 13 may buffer the first internal clock signal ICLKA to generate the latch clock signal LCLKA during the test period. In some embodiments, the latch clock generation circuit 13 may delay the first internal clock signal ICLKA to generate the latch clock signal LCLKA during the test period. A configuration and an operation of the latch clock generation circuit 13 will be described below with reference to FIG. 3.

The latch signal generation circuit 15 may generate a first latch signal CSLATA and a second latch signal CSLATB based on the latch clock signal LCLKA, the first internal control signal ICSA, and the second internal control signal ICSB. The latch signal generation circuit 15 may latch the first internal control signal ICSA in synchronization with the latch clock signal LCLKA to generate the first latch signal CSLATA. The latch signal generation circuit 15 may latch the second internal control signal ICSB in synchronization with the latch clock signal LCLKA to generate the second latch signal CSLATB. A configuration and an operation of the latch signal generation circuit 15 will be described below with reference to FIG. 4.

The alignment pulse generation circuit 17 may generate a first alignment pulse APUL1 and a second alignment pulse APUL2 from the first latch signal CSLATA and the latch clock signal LCLKA. The alignment pulse generation circuit 17 may be synchronized with the latch clock signal LCLKA to generate the first alignment pulse APUL1 when the first latch signal CSLATA is set to have a predetermined logic level. The alignment pulse generation circuit 17 may shift the latch clock signal LCLKA to generate the second alignment pulse APUL2 when the first alignment pulse APUL1 is generated. The alignment pulse generation circuit 17 may sequentially output the latch clock signal LCLKA as the first alignment pulse APUL1 and the second alignment pulse APUL2 while the first latch signal CSLATA is set to have a predetermined logic level. A configuration and an operation of the alignment pulse generation circuit 17 will be described below with reference to FIG. 5. The word "predetermined" as used herein with respect to a parameter, such as a predetermined logic level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The training result signal generation circuit 19 may generate a training result signal TMOUT based on the first alignment pulse APUL1, the second alignment pulse APUL2, the first latch signal CSLATA, and the second latch signal CSLATB. The training result signal generation circuit 19 may generate the training result signal TMOUT by latching the first alignment pulse APUL1 and the second alignment pulse APUL2 when the first alignment pulse APUL1 is generated and by latching the first alignment pulse APUL1 and the second alignment pulse APUL2 when the second alignment pulse APUL2 is generated. A configuration and an operation of the training result signal generation circuit 19 will be described below with reference to FIG. 6.

Figure 2:
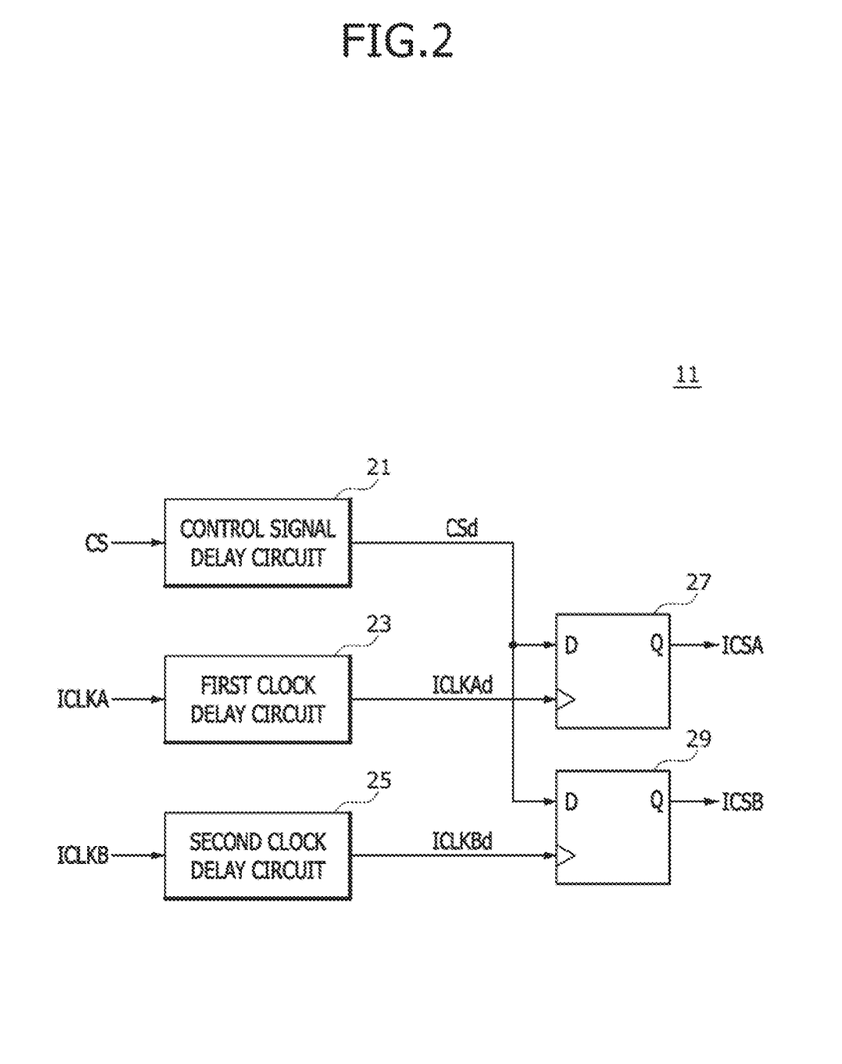
FIG. 2 illustrates an example of an internal control signal generation circuit included in the semiconductor device of FIG. 1.

Referring to FIG. 2, the internal control signal generation circuit 11 may include a control signal delay circuit 21, a first clock delay circuit 23, a second clock delay circuit 25, a first control signal output circuit 27, and a second control signal output circuit 29. The control signal delay circuit 21 may delay the control signal CS to generate a delayed control signal CSd. The first clock delay circuit 23 may delay the first internal clock signal ICLKA to generate a first delayed clock signal ICLKAd. The second clock delay circuit 25 may delay the second internal clock signal ICLKB to generate a second delayed clock signal ICLKBd. The first control signal output circuit 27 may be synchronized with the first delayed clock signal ICLKAd to latch the delayed control signal CSd and may output the latched signal of the delayed control signal CSd as the first internal control signal ICSA. The second control signal output circuit 29 may be synchronized with the second delayed clock signal ICLKBd to latch the delayed control signal CSd and may output the latched signal of the delayed control signal CSd as the second internal control signal ICSB. The internal control signal generation circuit 11 may latch the control signal CS in synchronization with the first internal clock signal ICLKA to generate the first internal control signal ICSA and may latch the control signal CS in synchronization with the second internal clock signal ICLKB to generate the second internal control signal ICSB.

Figure 3:
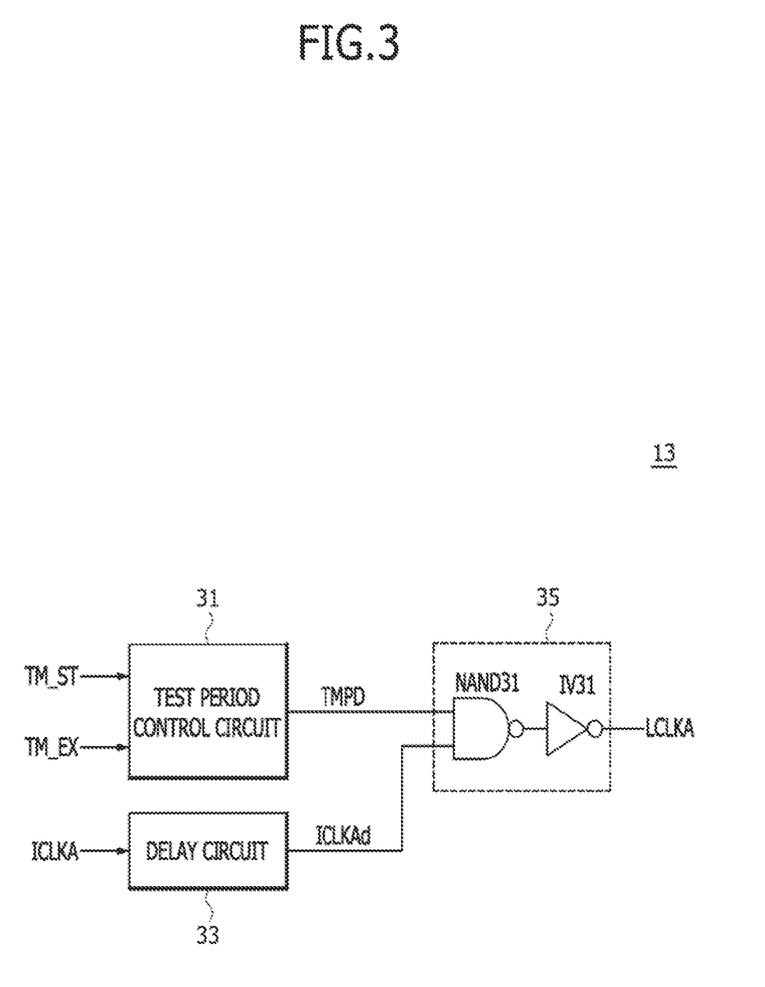
FIG. 3 illustrates an example of a latch clock generation circuit included in the semiconductor device of FIG. 1.

Referring to FIG. 3, the latch clock generation circuit 13 may include a test period control circuit 31, a delay circuit 33, and a latch clock output circuit 35. The test period control circuit 31 may generate a period signal TMPD which is created to have a logic "high" level by the test start signal TM_ST and the test exit signal TM_EX during the test period. The period signal TMPD may be generated to have a logic "high" level during the test period which is set as a time period from a point in time when the test start signal TM_ST is generated until a point in time when the test exit signal TM_EX is generated. The delay circuit 33 may delay the first internal clock signal ICLKA to generate the first delayed clock signal ICLKAd. The latch clock output circuit 35 may include a NAND gate NAND31 and an inverter IV31. The latch clock output circuit 35 may perform a logical AND operation of the period signal TMPD and the first delayed clock signal ICLKAd to generate the latch clock signal LCLKA. The latch clock output circuit 35 may generate the latch clock signal LCLKA from the period signal TMPD and the first delayed clock signal ICLKAd. The latch clock output circuit 35 may buffer the first delayed clock signal ICLKAd to generate the latch clock signal LCLKA during the test period when the period signal TMPD is generated to have a logic "high" level.

Figure 4:
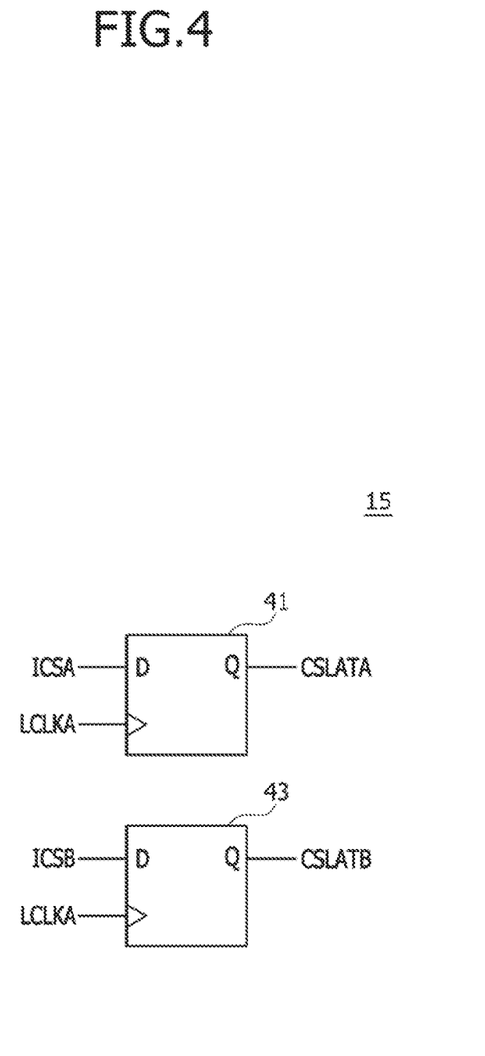
FIG. 4 illustrates an example of a latch signal generation circuit included in the semiconductor device of FIG. 1.

Referring to FIG. 4, the latch signal generation circuit 15 may include a first latch signal generation circuit 41 and a second latch signal generation circuit 43. Each of the first and second latch signal generation circuits 41 and 43 may be realized using a flip-flop. The first latch signal generation circuit 41 may be synchronized with the latch clock signal LCLKA to latch the first internal control signal ICSA and may output the latched signal of the first internal control signal ICSA as the first latch signal CSLATA. The second latch signal generation circuit 43 may be synchronized with the latch clock signal LCLKA to latch the second internal control signal ICSB and may output the latched signal of the second internal control signal ICSB as the second latch signal CSLATB.

Figure 5:
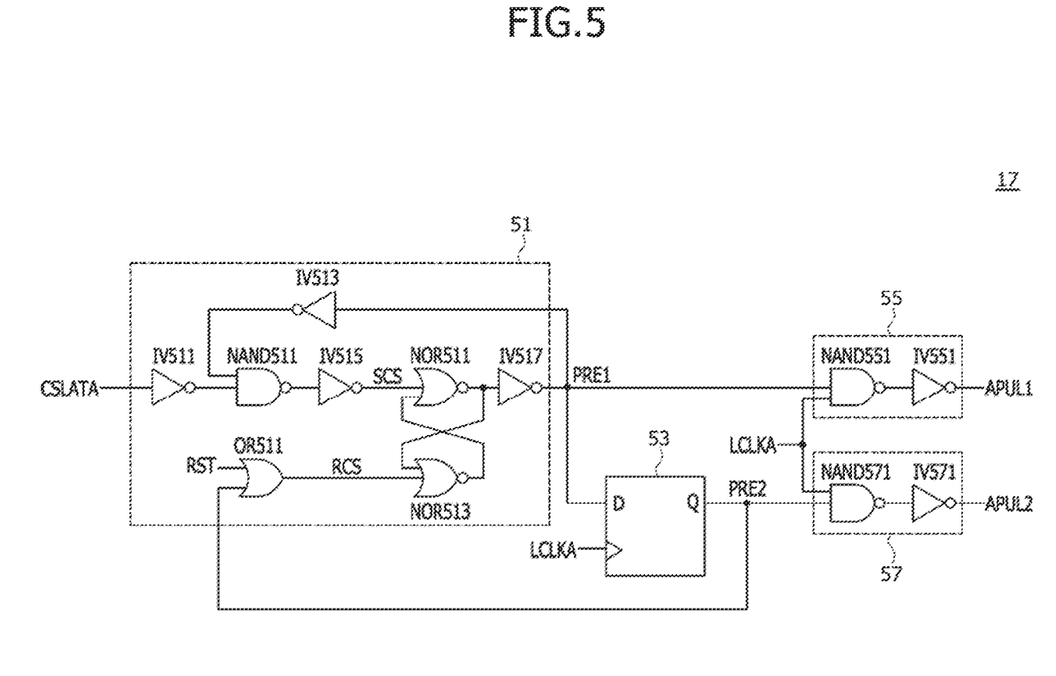
FIG. 5 is a circuit diagram illustrating an example of an alignment pulse generation circuit included in the semiconductor device of FIG. 1.

Referring to FIG. 5, the alignment pulse generation circuit 17 may include a first pre-signal generation circuit 51, a second pre-signal generation circuit 53, a first pulse output circuit 55, and a second pulse output circuit 57.

The first pre-signal generation circuit 51 may include inverters IV511, IV513, IV515 and IV517, a NAND gate NAND511, an OR gate OR511, and NOR gates NOR511 and NOR513. The inverter IV511 may inversely buffer the first latch signal CSLATA to output the inversely latched signal of the first latch signal CSLATA. The inverter IV513 may inversely buffer a first pre-signal PRE1 to output the inversely latched signal of the first pre-signal PRE1. The NAND gate NAND511 and the inverter IV515 sequentially connected in series may perform a logical NAND operation of output signals of the inverters IV511 and IV513 to generate a set control signal SCS. The set control signal SCS may be generated to have a logic "high" level when the first latch signal CSLATA having a logic "low" level is inputted to the first pre-signal generation circuit 51 while the first pre-signal PRE1 is set to have a logic "low" level. The OR gate OR511 may perform a logical OR operation of a reset signal RST and a second pre-signal PRE2 to generate a reset control signal RCS. The reset signal RST may be generated to have a logic "high" level to perform an initialization operation of the semiconductor device 1. The reset control signal RCS may be generated to have a logic "high" level when the reset signal RST is generated to have a logic "high" level or the second pre-signal PRE2 is generated to have a logic "high" level. The NOR gate NOR511 may perform a logical NOR operation of the set control signal SCS and an output signal of the NOR513. The NOR gate NOR513 may perform a logical NOR operation of the reset control signal RCS and an output signal of the NOR gate NOR511. The inverter IV517 may inversely buffer an output signal of the NOR gate NOR511 to output the first pre-signal PRE1. A logic level of the first pre-signal PRE1 may change from a logic "low" level into a logic "high" level when a logic level of the first latch signal CSLATA changes from a logic "high" level into a logic "low" level. A logic level of the first pre-signal PRE1 may change from a logic "high" level into a logic "low" level when the second pre-signal PRE2 has a logic "high" level or the reset signal RST has a logic "high" level.

The second pre-signal generation circuit 53 may be realized using a flip-flop. The second pre-signal generation circuit 53 may be synchronized with the latch clock signal LCLKCA to latch the first pre-signal PRE1 and may output the latched signal of the first pre-signal PRE1 as the second pre-signal PRE2. The second pre-signal generation circuit 53 may shift the first pre-signal PRE1 by one cycle time of the latch clock signal LCLKCA to generate the second pre-signal PRE2.

The first pulse output circuit 55 may include a NAND gate NAND551 and an inverter IV551 that are sequentially connected in series. The first pulse output circuit 55 may perform a logical AND operation of the first pre-signal PRE1 and the latch clock signal LCLKCA to generate the first alignment pulse APUL1. The first pulse output circuit 55 may generate the first alignment pulse APUL1 from the first pre-signal PRE1 and the latch clock signal LCLKCA. The first pulse output circuit 55 may buffer the latch clock signal LCLKCA to generate and output the first alignment pulse APUL1 when the first pre-signal PRE1 has a logic "high" level.

The second pulse output circuit 57 may include a NAND gate NAND571 and an inverter IV571 that are sequentially connected in series. The second pulse output circuit 57 may perform a logical AND operation of the second pre-signal PRE2 and the latch clock signal LCLKCA to generate the second alignment pulse APUL2. The second pulse output circuit 57 may generate the second alignment pulse APUL2 from the second pre-signal PRE2 and the latch clock signal LCLKCA. The second pulse output circuit 57 may buffer the latch clock signal LCLKCA to generate and output the second alignment pulse APUL2 when the second pre-signal PRE2 has a logic "high" level.

The alignment pulse generation circuit 17 may sequentially output the latch clock signal LCLKCA as the first alignment pulse APUL1 and second alignment pulse APUL2 while the first latch signal CSLATA is set to have a logic "low" level.

Figure 6:
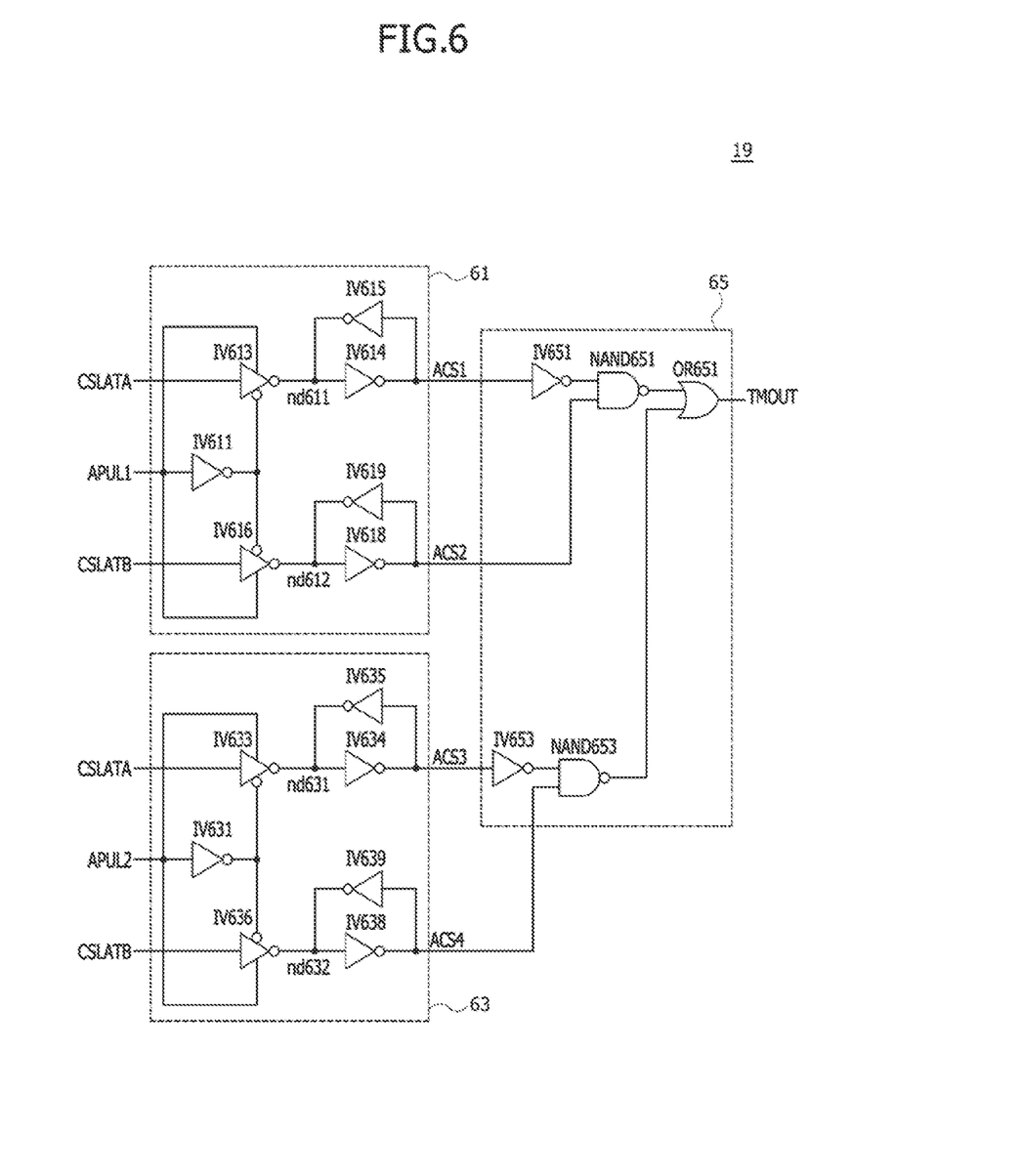
FIG. 6 is a circuit diagram illustrating an example of a training result signal generation circuit included in the semiconductor device of FIG. 1.

Referring to FIG. 6, the training result signal generation circuit 19 may include a first alignment signal output circuit 61, a second alignment signal output circuit 63, and a training result signal output circuit 65.

The first alignment signal output circuit 61 may include inverters IV611, IV613, IV614, IV615, IV616, IV618 and IV619. The inverter IV611 may inversely buffer the first alignment pulse APUL1 to output the inversely buffered signal of the first alignment pulse APUL1. The inverter IV613 may inversely buffer the first latch signal CSLATA to output the inversely buffered signal of the first latch signal CSLATA to a node nd611 when the first alignment pulse APUL1 is generated to have a logic "high" level. The inverter IV614 may inversely buffer a signal of the node nd611 to output the inversely buffered signal of the node 611 as a first alignment signal ACS1. The inverter IV615 may inversely buffer the first alignment signal ACS1 to output the inversely buffered signal of the first alignment signal ACS1 to the node nd611. The inverter IV616 may inversely buffer the second latch signal CSLATB to output the inversely buffered signal of the second latch signal CSLATB to a node nd612 when the first alignment pulse APUL1 is generated to have a logic "high" level. The inverter IV618 may inversely buffer a signal of the node nd612 to output the inversely buffered signal of the node 612 as a second alignment signal ACS2. The inverter IV619 may inversely buffer the second alignment signal ACS2 to output the inversely buffered signal of the second alignment signal ACS2 to the node nd612. The first alignment signal output circuit 61 may buffer the first latch signal CSLATA to output the buffered signal of the first latch signal CSLATA as the first alignment signal ACS1 and may buffer the second latch signal CSLATB to output the buffered signal of the second latch signal CSLATB as the second alignment signal ACS2, when the first alignment pulse APUL1 is generated to have a logic "high" level.

The second alignment signal output circuit 63 may include inverters IV631, IV633, IV634, IV635, IV636, IV638 and IV639. The inverter IV631 may inversely buffer the second alignment pulse APUL2 to output the inversely buffered signal of the second alignment pulse APUL2. The inverter IV633 may inversely buffer the first latch signal CSLATA to output the inversely buffered signal of the first latch signal CSLATA to a node nd631 when the second alignment pulse APUL2 is generated to have a logic "high" level. The inverter IV634 may inversely buffer a signal of the the node nd631 to output the inversely buffered signal of the node 631 as a third alignment signal ACS3. The inverter IV635 may inversely buffer the third alignment signal ACS3 to output the inversely buffered signal of the third alignment signal ACS3 to the node nd631. The inverter IV636 may inversely buffer the second latch signal CSLATB to output the inversely buffered signal of the second latch signal CSLATB to a node nd632 when the second alignment pulse APUL2 is generated to have a logic "high" level. The inverter IV638 may inversely buffer a signal of the node nd632 to output the inversely buffered signal of the node 632 as a fourth alignment signal ACS4. The inverter IV639 may inversely buffer the fourth alignment signal ACS4 to output the inversely buffered signal of the fourth alignment signal ACS4 to the node nd632. The second alignment signal output circuit 63 may buffer the first latch signal CSLATA to output the buffered signal of the first latch signal CSLATA as the third alignment signal ACS3 and may buffer the second latch signal CSLATB to output the buffered signal of the second latch signal CSLATB as the fourth alignment signal ACS4, when the second alignment pulse APUL2 is generated to have a logic "high" level.

The training result signal output circuit 65 may include inverters IV651 and IV653, NAND gates NAND651 and NAND653, and an OR gate OR651. The inverter IV651 may inversely buffer the first alignment signal ACS1 to output the inversely buffered signal of the first alignment signal ACS1. The NAND gate NAND651 may perform a logical NAND operation of an output signal of the inverter IV651 and the second alignment signal ACS2 to output the result of the logical NAND operation. The inverter IV653 may inversely buffer the third alignment signal ACS3 to output the inversely buffered signal of the third alignment signal ACS3. The NAND gate NAND653 may perform a logical NAND operation of an output signal of the inverter IV653 and the fourth alignment signal ACS4 to output the result of the logical NAND operation. The OR gate OR651 may perform a logical OR operation of an output signal of the NAND gate NAND651 and an output signal of the NAND gate NAND653 to generate the training result signal TMOUT. The training result signal output circuit 65 may generate the training result signal TMOUT having a logic "low" level when the first and third alignment signals ACS1 and ACS3 have a logic "low" level and the second and fourth alignment signals ACS2 and ACS4 have a logic "high" level.

An operation of the semiconductor device 1 will be described hereinafter with reference to FIGS. 7 and 8.

Figure 7:
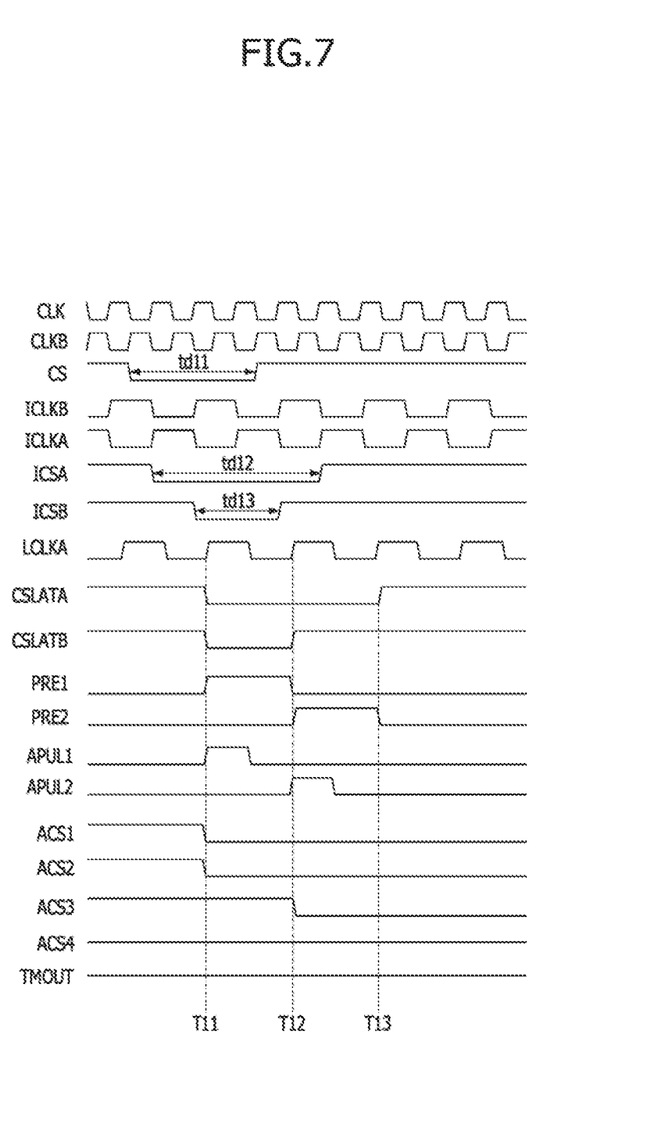
FIGS. 7 and 8 are timing diagrams illustrating operations of the semiconductor devices shown in FIG. 1.

As illustrated in FIG. 7, while the clock signal CLK and the inverted clock signal CLKB are divided to generate the first internal clock signal ICLKA and the second internal clock signal ICLKB, the chip selection signal (i.e, the control signal CS) may be latched in synchronization with the first internal clock signal ICLKA to generate the first internal control signal ICSA and the chip selection signal CS may be latched in synchronization with the second internal clock signal ICLKB to generate the second internal control signal ICSB. When the chip selection signal CS having a logic "low" level is transmitted from a memory controller (1002 of FIG. 9) to the semiconductor device 1 during a time period td11, the first internal control signal ICSA may be set to have a logic "low" level during a time period td12 and the second internal control signal ICSB may be set to have a logic "low" level during a time period td13. The latch clock signal LCLKA may be generated by delaying the first internal clock signal ICLKA during the test period. The first internal control signal ICSA may be latched in synchronization with the latch clock signal LCLKA to generate the first latch signal CSLATA, and the second internal control signal ICSB may be latched in synchronization with the latch clock signal LCLKA to generate the second latch signal CSLATB. The first latch signal CSLATA may be set to have a logic "low" level during a period from a point in time "T11" until a point in time "T13", and the second latch signal CSLATB may be set to have a logic "low" level during a period from the point in time "T11" until a point in time "T12". The first pre-signal PRE1 may be generated to have a logic "high" level during a period from the point in time "T11" until the point in time "T12" (i.e., while the first latch signal CSLATA is set to have a logic "low" level), and the second pre-signal PRE2 may be generated to have a logic "high" level during a period from the point in time "T12" until the point in time "T13" (i.e., while the first latch signal CSLATA may be set to have a logic "low" level). The latch clock signal LCLKA may be buffered to generate the first alignment pulse APUL1 during a period from the point in time "T11" until the point in time "T12" (i.e., while the first pre-signal PRE1 is set to have a logic "high" level). The latch clock signal LCLKA may be buffered to generate the second alignment pulse APUL2 during a period from the point in time "T12" until the point in time "T13" (i.e., while the second pre-signal PRE2 is set to have a logic "high" level). When the first alignment pulse APUL1 is generated, the first latch signal CSLATA may be outputted as the first alignment signal ACS1 and the second latch signal CSLATB may be outputted as the second alignment signal ACS2. When the second alignment pulse APUL2 is generated, the first latch signal CSLATA may be outputted as the third alignment signal ACS3 and the second latch signal CSLATB may be outputted as the fourth alignment signal ACS4. Levels of the first and second alignment signals ACS1 and ACS2 may change from a logic "high" level into a logic "low" level at the point in time "T11", a level of the third alignment signal ACS3 may change from a logic "high" level into a logic "low" level at the point in time "T12", and a level of the fourth alignment signal ACS4 may maintain a logic "high" level at all of points in time "T11", "T12" and "T13". Thus, the training result signal TMOUT generated by the first to fourth alignment signals ACS1, ACS2, ACS3 and ACS4 may maintain a logic "high" level. When the training result signal TMOUT maintains a logic "high" level, it means that the chip selection signal CS is not toggled in synchronization with the clock signal CLK.

Figure 8:
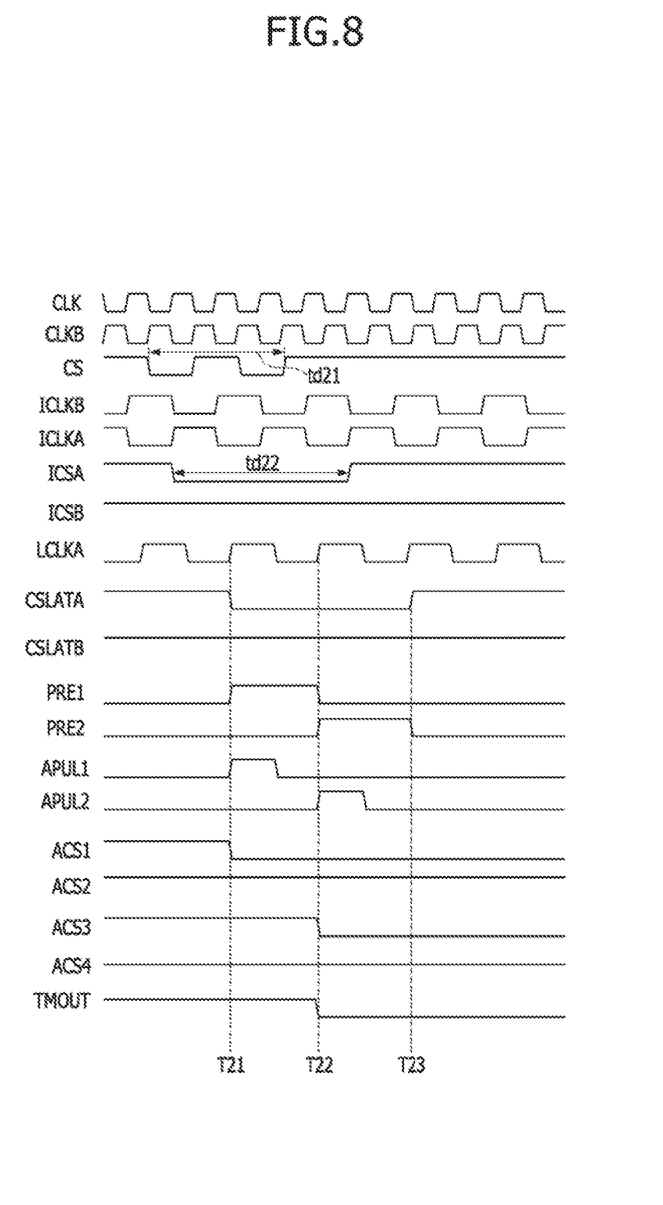

As illustrated in FIG. 8, the chip selection signal (i.e., the control signal CS) may be latched in synchronization with the first internal clock signal ICLKA to generate the first internal control signal ICSA, and the chip selection signal CS may be latched in synchronization with the second internal clock signal ICLKB to generate the second internal control signal ICSB. When the chip selection signal CS, which is toggled, is transmitted from a memory controller (1002 of FIG. 9) to the semiconductor device 1 during a time period td21, the first internal control signal ICSA may be set to have a logic "low" level during a time period td22 and the second internal control signal ICSB may be set to have a logic "high" level all the time. The latch clock signal LCLKA may be generated by delaying the first internal clock signal ICLKA during the test period. The first internal control signal ICSA may be latched in synchronization with the latch clock signal LCLKA to generate the first latch signal CSLATA, and the second internal control signal ICSB may be latched in synchronization with the latch clock signal LCLKA to generate the second latch signal CSLATB. The first latch signal CSLATA may be set to have a logic "low" level during a period from a point in time "T21" until a point in time "T23", and the second latch signal CSLATB may be set to have a logic "high" level all the time. The first pre-signal PRE1 may be generated to have a logic "high" level during a period from the point in time "T21" until a point in time "T22" (i.e., while the first latch signal CSLATA is set to have a logic "low" level), and the second pre-signal PRE2 may be generated to have a logic "high" level during a period from the point in time "T22" until the point in time "T23" (i.e., while the first latch signal CSLATA may be set to have a logic "low" level). The latch clock signal LCLKA may be buffered to generate the first alignment pulse APUL1 during a period from the point in time "T21" until the point in time "T22" (i.e., while the first pre-signal PRE1 is set to have a logic "high" level). The latch clock signal LCLKA may be buffered to generate the second alignment pulse APUL2 during a period from the point in time "T22" until the point in time "T23" (i.e., while the second pre-signal PRE2 is set to have a logic "high" level). When the first alignment pulse APUL1 is generated, the first latch signal CSLATA may be outputted as the first alignment signal ACS1 and the second latch signal CSLATB may be outputted as the second alignment signal ACS2. When the second alignment pulse APUL2 is generated, the first latch signal CSLATA may be outputted as the third alignment signal ACS3 and the second latch signal CSLATB may be outputted as the fourth alignment signal ACS4. A level of the first alignment signal ACS1 may change from a logic "high" level into a logic "low" level at the point in time "T21", the second alignment signal ACS2 may maintain a logic "high" level all the time, a level of the third alignment signal ACS3 may change from a logic "high" level into a logic "low" level at the point in time "T22", and the fourth alignment signal ACS4 may maintain a logic "high" level all the time. A level of the training result signal TMOUT may be changed from a logic "high" level into a logic "low" level by the first and third alignment signals ACS1 and ACS3 having a logic "low" level and the second and fourth alignment signals ACS2 and ACS4 having a logic "high" level at the point in time "T22". When a level of the training result signal TMOUT changes from a logic "high" level into a logic "low" level, it means that the chip selection signal CS is toggled in synchronization with the clock signal CLK.

As described above, the semiconductor device 1 may generate the training result signal TMOUT, which informs whether the chip selection signal CS inputted to the semiconductor device 1 is toggled in synchronization with the clock signal CLK, from the first and second latch signals CSLATA and CSLATB generated in synchronization with the latch clock signal LCLKCA generated from the first internal clock signal ICLKA. That is, the semiconductor device 1 may discriminate whether the chip selection signal CS is toggled in synchronization with the clock signal CLK using only the latch clock signal LCLKA without using a plurality of internal clock signals. Accordingly, it may be possible to reduce power consumption of the semiconductor device 1 and a layout area of a circuit for training the chip selection signal CS.

According to the above embodiments, one of internal clock signals generated by dividing a clock signal may be selected as a latch clock signal, an internal chip selection signal may be latched in synchronization with the latch clock signal to generate latch signals, and a training result signal may be generated based on the latch signals. As a result, it may be unnecessary to generate extra internal clock signals for detecting edges of the internal chip selection signal during a test period. Thus, it may be possible to train a chip selection signal with reduced power consumption without degradation of integration density of a semiconductor device.

Figure 9:
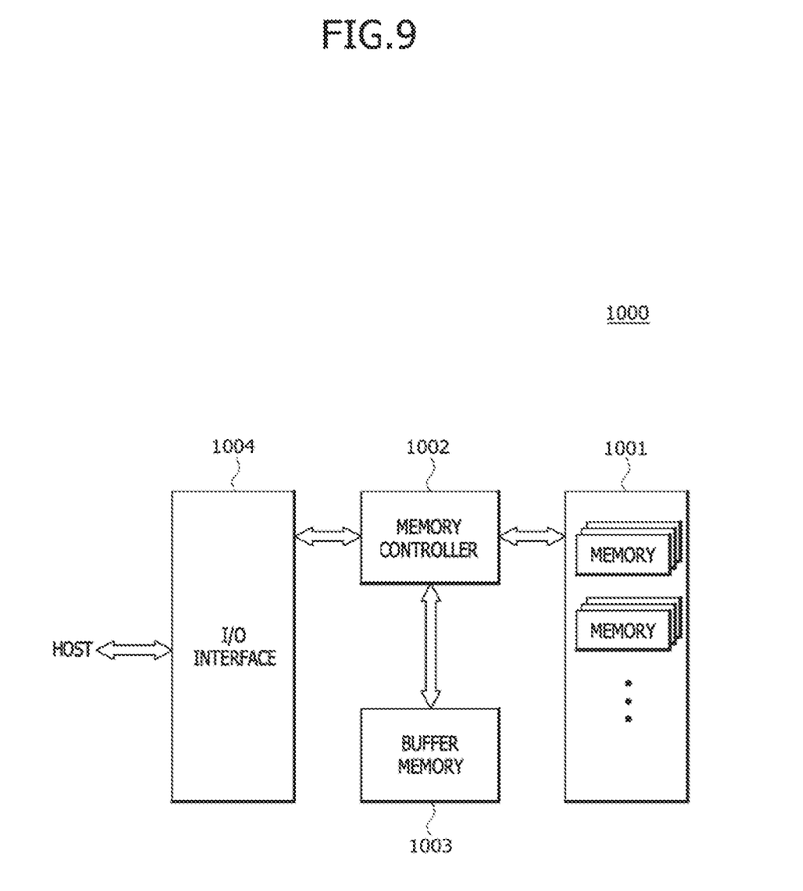
FIG. 9 is a block diagram illustrating a configuration of an example of an electronic system employing the semiconductor devices shown in FIG. 1.

The semiconductor device 1 described with reference to FIG. 1 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 9 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include the semiconductor devices 1 illustrated in FIG. 1. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a latch signal generation circuit configured to latch a first internal control signal and a second internal control signal in synchronization with a latch clock signal to generate a first latch signal and a second latch signal, wherein the first internal control signal is generated based on a first internal clock signal and a control signal, and wherein the second internal control signal is generated based on a second internal clock signal and the control signal; and
    a training result signal generation circuit configured to be synchronized with a first alignment pulse and a second alignment pulse generated based on the first latch signal and the second latch signal to generate a training result signal from the first and second latch signals.

2. The semiconductor device of claim 1, wherein the first and second internal clock signals are generated by dividing a clock signal.

3. The semiconductor device of claim 1,
    wherein the first internal control signal is generated by latching the control signal in synchronization with the first internal clock signal; and
    wherein the second internal control signal is generated by latching the control signal in synchronization with the second internal clock signal.

4. The semiconductor device of claim 1, wherein the latch clock signal is generated by performing at least one of buffering and delaying the first internal clock signal during a test period.

5. The semiconductor device of claim 1,
    wherein the first alignment pulse is created during a first period when the first latch signal is set to have a predetermined logic level; and
    wherein the second alignment pulse is created during a second period when the first latch signal is set to have the predetermined logic level.

6. The semiconductor device of claim 5, wherein the first and second periods are time periods which are successively set.

7. The semiconductor device of claim 6, wherein the first period is set to have one cycle time of the first internal clock signal and the second period is set to have one cycle time of the first internal clock signal.

8. The semiconductor device of claim 1, further comprising:
    a first pre-signal generation circuit configured to generate a first pre-signal during a first period when the first latch signal is set to have a predetermined logic level; and
    a first pulse output circuit configured to generate the first alignment pulse from the latch clock signal during the first period.

9. The semiconductor device of claim 8, further comprising;
    a second pre-signal generation circuit configured to shift the first pre-signal in synchronization with the latch clock signal to generate a second pre-signal during a second period; and
    a second pulse output circuit configured to generate the second alignment pulse from the latch clock signal during the second period.

10. The semiconductor device of claim 1, wherein level transition of the training result signal occurs when the control signal is toggled in synchronization with the first internal clock signal and the second internal clock signal.

11. The semiconductor device of claim 1, wherein when the training result signal is maintained at a predetermined logic level during a test period the control signal is not toggled in synchronization with the first and second internal clock signals.

12. The semiconductor device of claim 1, wherein the training result signal generation circuit includes:
    a first alignment signal output circuit configured to generate a first alignment signal and a second alignment signal from the first latch signal and the second latch signal when the first alignment pulse is created;
    a second alignment signal output circuit configured to generate a third alignment signal and a fourth alignment signal from the first latch signal and the second latch signal when the second alignment pulse is created; and
    a training result signal output circuit configured to generate the training result signal based on the first to fourth alignment signals.

13. A semiconductor device comprising:
    a latch signal generation circuit configured to latch a first internal control signal and a second internal control signal in synchronization with a latch clock signal to generate a first latch signal and a second latch signal, wherein the first and second internal control signals are generated based on a control signal, a first internal clock signal, and a second internal clock signal;
    an alignment pulse generation circuit configured to generate a first alignment pulse during a first period when the first latch signal is set to have a predetermined logic level and configured to generate a second alignment pulse during a second period when the first latch signal is set to have the predetermined logic level; and a training result signal generation circuit configured to generate a training result signal having a level transition occurring when the control signal is toggled in synchronization with the first and second internal clock signals.

14. The semiconductor device of claim 13, wherein the first and second internal clock signals are generated by dividing a clock signal.

15. The semiconductor device of claim 13, wherein the first internal control signal is generated by latching the control signal in synchronization with the first internal clock signal; and wherein the second internal control signal is generated by latching the control signal in synchronization with the second internal clock signal.

16. The semiconductor device of claim 13, wherein the latch clock signal is generated by performing at least one of buffering and delaying the first internal clock signal during a test period.

17. The semiconductor device of claim 13, wherein the first and second periods are time periods which are successively set.

18. The semiconductor device of claim 13, wherein the first period is set to have one cycle time of the first internal clock signal and the second period is set to have one cycle time of the first internal clock signal.

19. The semiconductor device of claim 13, wherein the alignment pulse generation circuit includes:

a first pre-signal generation circuit configured to generate a first pre-signal during the first period when the first latch signal is set to have a predetermined logic level; and a first pulse output circuit configured to generate the first alignment pulse from the latch clock signal during the first period.

20. The semiconductor device of claim 19, further comprising;

a second pre-signal generation circuit configured to shift the first pre-signal in synchronization with the latch clock signal to generate a second pre-signal during the second period; and a second pulse output circuit configured to generate the second alignment pulse from the latch clock signal during the second period.

21. The semiconductor device of claim 13, wherein the training result signal generation circuit includes:

a first alignment signal output circuit configured to generate a first alignment signal and a second alignment signal from the first latch signal and the second latch signal when the first alignment pulse is created;

a second alignment signal output circuit configured to generate a third alignment signal and a fourth alignment signal from the first latch signal and the second latch signal when the second alignment pulse is created; and a training result signal output circuit configured to generate the training result signal based on the first to fourth alignment signals.

22. A semiconductor device comprising:

a latch signal generation circuit configured to latch a first internal control signal and a second internal control signal in synchronization with a latch clock signal to generate a first latch signal and a second latch signal, wherein the first internal control signal is generated based on a first internal clock signal and a control signal, and wherein the second internal control signal is generated based on a second internal clock signal and the control signal; and a training result signal generation circuit configured to generate a training result signal from the first and second latch signals, the training result signal indicating when the control signal is toggling in synchronization with the first internal clock signal and the second internal clock signal during a test period.

* * * * *